(12) United States Patent
Hsieh et al.

(10) Patent No.: US 12,021,177 B2
(45) Date of Patent: Jun. 25, 2024

(54) DISPLAY DEVICE USING LIGHT-EMITTING DIODE

(71) Applicants: EPISTAR CORPORATION, Hsinchu (TW); Yenrich Technology Corporation, Hsinchu (TW)

(72) Inventors: Min-Hsun Hsieh, Hsinchu (TW); Chun-Wei Chen, Hsinchu (TW)

(73) Assignees: EPISTAR CORPORATION, Hsinchu (TW); YENRICH TECHNOLOGY CORPORATION, Hsinchu (TW)

( * ) Notice: Subject to any disclaimer, the term of this patent is extended or adjusted under 35 U.S.C. 154(b) by 498 days.

(21) Appl. No.: 17/400,640

(22) Filed: Aug. 12, 2021

(65) Prior Publication Data

US 2023/0048631 A1    Feb. 16, 2023

(51) Int. Cl.
| | |
|---|---|
| *H01L 33/62* | (2010.01) |
| *H01L 25/075* | (2006.01) |
| *H01L 27/15* | (2006.01) |
| *H01L 33/48* | (2010.01) |
| *H01L 33/56* | (2010.01) |

(52) U.S. Cl.
CPC .......... *H01L 33/62* (2013.01); *H01L 25/0753* (2013.01); *H01L 27/156* (2013.01); *H01L 33/486* (2013.01); *H01L 33/56* (2013.01)

(58) Field of Classification Search
CPC ............... H01L 33/62; H01L 25/0753; H01L 27/156; H01L 33/486; H01L 33/56; H01L 25/167
See application file for complete search history.

(56) References Cited

U.S. PATENT DOCUMENTS

| | | | |
|---|---|---|---|
| 9,941,259 B2* | 4/2018 | Yoo | H01L 33/0075 |
| 10,468,392 B2* | 11/2019 | Yoo | H01L 33/00 |
| 2014/0217429 A1 | 8/2014 | Lin et al. | |
| 2020/0052033 A1* | 2/2020 | Iguchi | H01L 27/156 |

\* cited by examiner

*Primary Examiner* — Jonathan Han
(74) *Attorney, Agent, or Firm* — Patterson + Sheridan, LLP

(57) ABSTRACT

A display device includes LEDs, a circuit board, an insulating layer, conductive posts, a control conductive plate, and a common conductive strip. The circuit board includes first pads and a second pad surrounding the first pads. The LEDs are on an insulating layer covering the first pads, each including a first and second electrode pad. The conductive posts are on and connected to a first portion of the first pads, and penetrate the insulation layer. The control conductive plate is electrically connected to one of the first electrode pads and the conductive posts. The common conductive strip is on the insulation layer and electrically connected to the second pad and a second electrode pad. Each first electrode pad is electrically connected to the first pads. A second portion of the first pads is completely covered by the insulation layer and overlapped with the common conductive strip and the insulation layer.

20 Claims, 7 Drawing Sheets

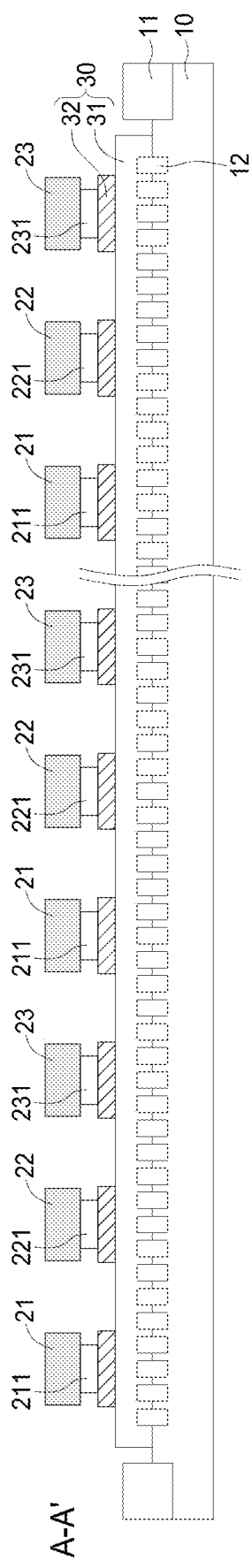
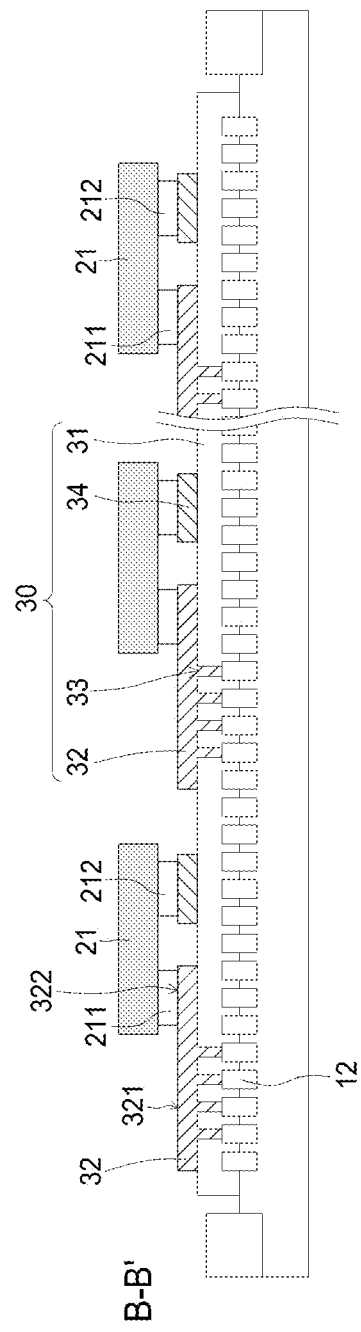
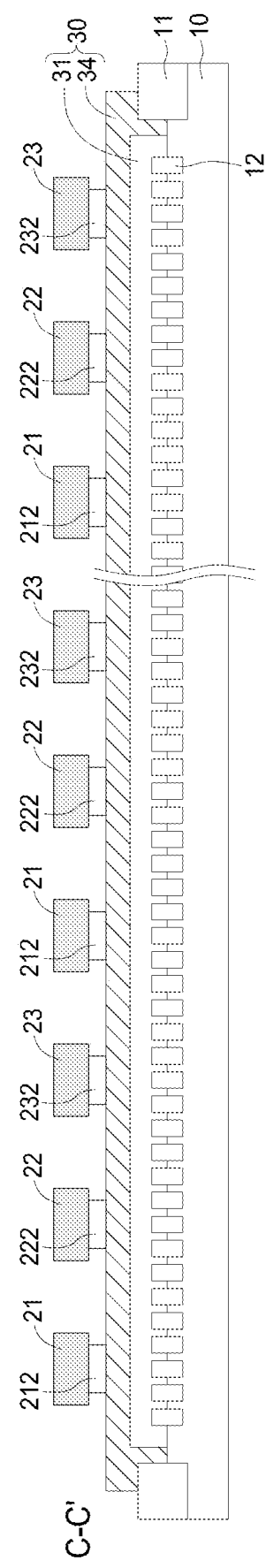
FIG. 2A
FIG. 2B
FIG. 2C

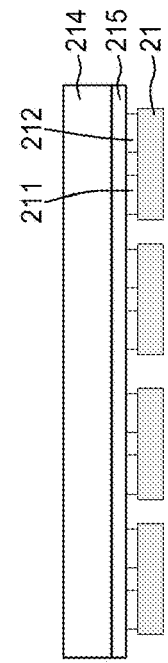
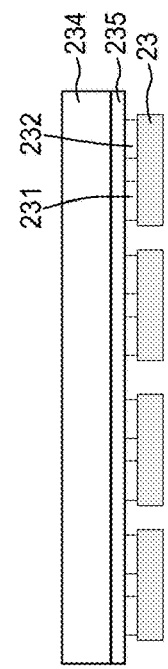
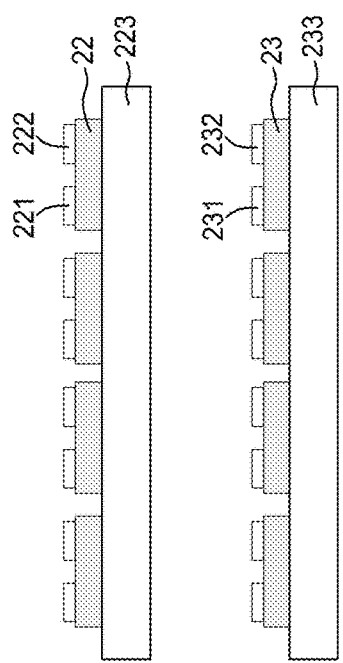
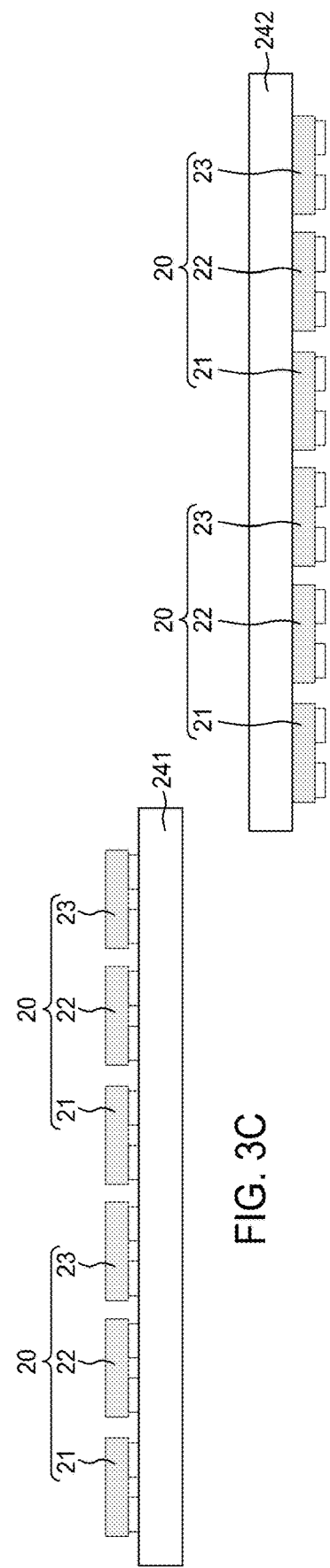

DISPLAY DEVICE USING LIGHT-EMITTING DIODE

TECHNICAL FIELD

The present disclosure relates to a display device, particularly to the display device using light-emitting diodes as pixels.

DESCRIPTION OF THE RELATED ART

The light-emitting diodes (LEDs) have the characteristics of low power consumption, long operating life, small volume, fast response, and stable optical output so the LEDs are gradually replacing traditional lighting source and are widely used in various lighting devices.

LEDs are a type of monochromatic light and therefore are well suitable for being pixels in displays. For example, it can be used as a pixel for an outdoor or indoor display. To achieve a higher resolution, more and more LEDs used in the display dramatically increase the pixel density. The yield rate of handling the tremendous number of LEDs becomes a big challenge.

SUMMARY OF THE DISCLOSURE

The following description illustrates embodiments and together with drawings to provide a further understanding of the disclosure described above.

A display device includes a plurality of LEDs, a circuit board, an insulating layer, a plurality of conductive posts, a control conductive plate, and a common conductive strip. The circuit board includes a plurality of first pads and a second pad surrounding the plurality of first pads. The insulation layer covers the plurality of first pads. The plurality of LEDs is located on the insulating layer. Each of plurality of LEDs includes a first electrode pad and a second electrode pad. The plurality of conductive posts is located on and connected to a first portion of the plurality of first pads, and penetrates the insulation layer. The control conductive plate is electrically connected to one of the first electrode pads and the plurality of conductive posts. The common conductive strip is located on the insulation layer and electrically connected to the second pad and one of the second electrode pads. Each of the plurality of first electrode pads is electrically connected to at least two of the first pads. A second portion of the plurality of first pads is completely covered by the insulation layer. The second portion of first pads is overlapped with the common conductive strip and the insulation layer in an orthogonal projected direction.

BRIEF DESCRIPTION OF THE DRAWINGS

FIGS. 2A-2C show partial cross-sectional views of a display device shown in FIG. 1A.

FIGS. 3A-3F illustrate steps of manufacturing a display device in accordance with an embodiment of the present disclosure.

DETAILED DESCRIPTION OF THE EMBODIMENTS

The drawings illustrate the embodiments of the application and, together with the description, serve to illustrate the principles of the application. The same name or the same reference number given or appeared in different paragraphs or figures along the specification should has the same or equivalent meanings while it is once defined anywhere of the disclosure. The thickness or the shape of an element in the specification can be expanded or narrowed.

Figure 1A:
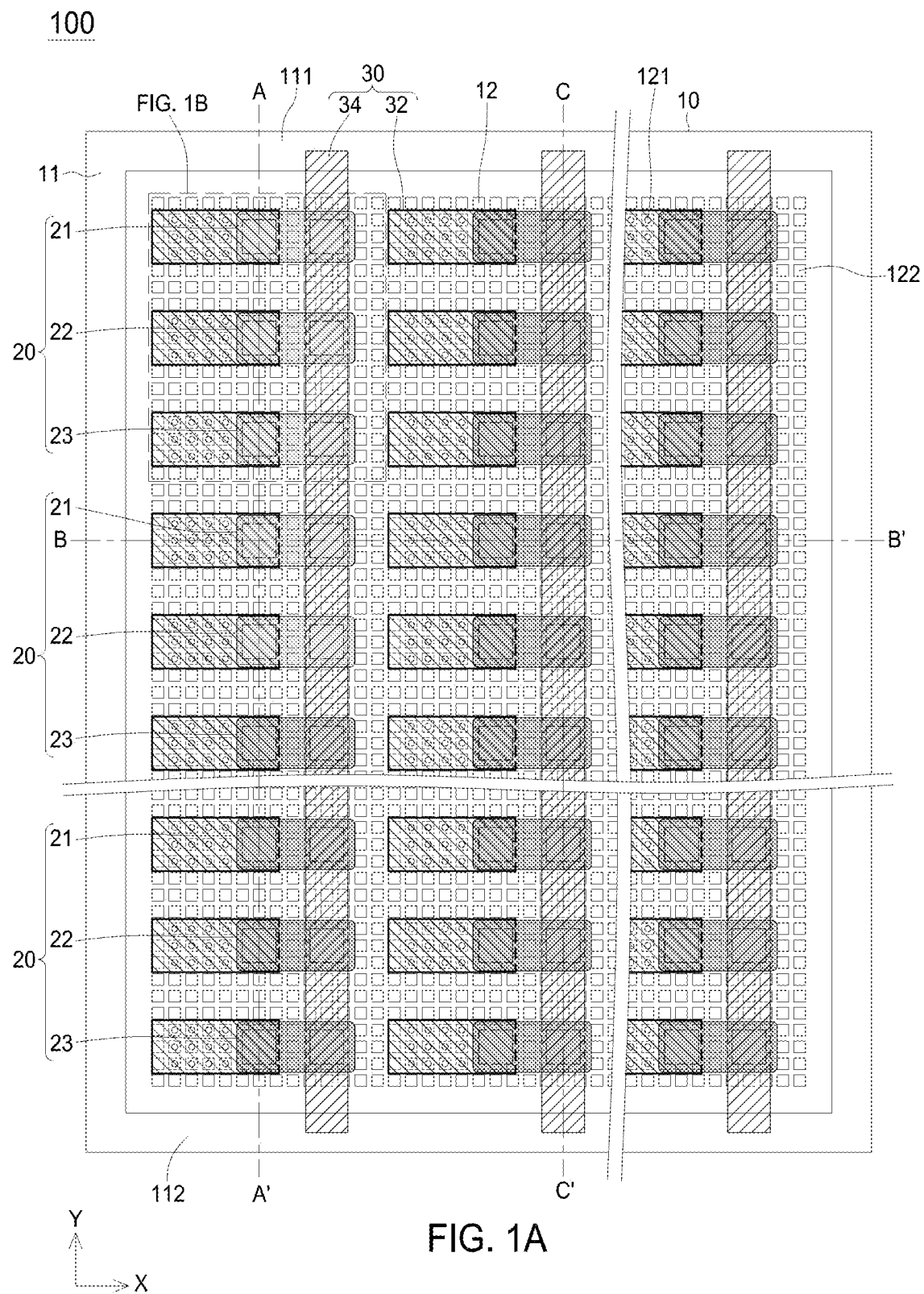
FIG. 1A shows a top view of a display device in accordance with an embodiment of the present disclosure.

FIG. 1A shows a top view of a display device 100 in accordance with an embodiment of the present disclosure. The display device 100 includes a circuit board 10, and a plurality of pixels 20 disposed on the circuit board 10. A redistribution layer 30 disposed between the circuit board 10 and the plurality of pixels 20. The circuit board 10 includes a plurality of first pads 12 which has the same electrical polarity and is located in the central region of the circuit board 10. The circuit board has a second pad 11 which is located in the peripheral region and surrounds the plurality of first pads 12. The first pad 12 and the second pad 11 are served to operate under opposite polarities, for example, as an anode and a cathode. The plurality of first pads 12 is arranged in an array configuration, and each of the plurality of first pads 12 is an independent channel for transmitting the operation signal and/or power.

The plurality of pixels 20 is arranged in a matrix form, and can be driven in a passive matrix addressing or active matrix addressing. Each pixel 20 includes three or more LEDs. In an embodiment, the pixel 20 includes a first LED 21, a second LED 22, and a third LED 23 which have different peak/dominant wavelengths and are capable of emitting different color lights, such as, red light, green light, blue light, cyan light, and pink light. In an embodiment, the first LED 21 can emit blue light and has a peak/dominant wavelength ranging of 430 nm to 490 nm, the second LED 22 can emit green light and has a peak/dominant wavelength ranging of 510 nm to 570 nm, and the third LED 23 can emit red light and has a peak/dominant wavelength ranging of 600 nm to 720 nm. The LEDs (21, 22, 23) within a single pixel 20 can be controlled through respective/separated first pads 12. In such a way, the respective LED within a single pixel 20 is independently controlled and operated to emit its color light. With a mixture of color lights from the three or more LEDs, the pixels 20 can provide full color images. The circuitry of the circuit board 10 can be a CMOS circuitry or a TFT circuitry.

As shown in FIG. 1A, in an orthogonal projected direction, one of the LEDs (21, 22, 23) can overlap at least two first pads 12. A plurality of first pads 12 is exposed between adjacent LEDs and is not covered by the LED (21, 22, 23). In other words, the plurality of first pads 12 is not one-by-one connected to the plurality of LEDs (21, 22, 23). A first portion 121 of the first pads 12 is electrically connected to the one of the LEDs (21, 22, 23). A second portion 122 of the plurality of first pads 12 is not electrically connected to the plurality of LEDs and is electrically isolated from the plurality of LEDs (21, 22, 23). The number of the first pads 12 is more than that of the LEDs (21, 22, 23).

The redistribution layer 30 is used to provide the power from the circuit board 10 to the plurality of LEDs (21, 22, 23), and includes a plurality of common conductive strips 34 and a plurality of control conductive plates 32. The common conductive strip 34 crosses over the circuit board 10 in the longitudinal direction (Y direction), and overlaps the upper side 111 and the lower side 112 of the second pad 11. The common conductive strip 34 is electrically isolated from the plurality of first pads 12 by an isolation layer 31 (as shown in FIG. 2C). In an orthogonal projected direction, the plurality of LEDs 20 which is located in the same column partially overlaps a single common conductive strip 34. The plurality of LEDs 20 which is located in the same column is electrically connected to the corresponding common conductive strip 34 and electrically connected to the second pad 11. The control conductive plates 32 are electrically connected to respective LEDs. Hence, the different LEDs can be controlled respectively through different control conductive plates 32. In an orthogonal projected direction, the common conductive strip 34 overlaps at least two first pads 12, and the control conductive plate 32 overlaps at least two first pads 12. The common conductive strip 34 extends in a first extending direction which is parallel to the longitudinal direction (Y direction). The control conductive plate 32 extends in a second extending direction which is different from the first extending direction and parallel to the transverse direction (X direction).

Optionally, an encapsulating layer (not shown) is formed on the plurality of LEDs, and covers the circuit board 10 and the redistribution layer 30. The encapsulating layer is pervious to the light emitted from the plurality of LEDs. The encapsulating layer can be a transparent/translucent material which can be epoxy resin, BT (Bismaleimide Triazine), polyimide. In an embodiment, the encapsulating layer is mixed with a black substance, such as carbon powder, and has a translucent and darker appearance for increasing the contrast of the display device 100.

The LED is a semiconductor light-emitting element which can emit a non-coherent light, and includes a substrate, a first semiconductor layer, an active region, and a second semiconductor layer. The first semiconductor layer and the second semiconductor layer can be a cladding layer or a confinement layer. The first semiconductor layer and the second semiconductor layer can provide electrons and holes, respectively. The electrons and holes are recombined in the active region to emit light. The first semiconductor layer, the active region, and the second semiconductor layer can include a semiconductor material of III-V group, such as $Al_xIn_yGa_{(1-x-y)}N$ or $Al_xIn_yGa_{(1-x-y)}P$, where $0 \le x \le 1$; $0 \le y \le 1$; $(x+y) \le 1$. Based on the material of the active region, the light-emitting unit can emit an infrared light, a red light, a green light, a blue light, a violet light, or an ultra-violet light. The substrate can be a growth substrate for epitaxially growing the first semiconductor layer, the active region, and the second semiconductor layer in sequence thereon; or be a support for carrying the first semiconductor layer, the active region, and the second semiconductor layer in sequence located thereon after removing the growth substrate. The growth substrate can be made of a material, such as Ge, GaAs, InP, sapphire, SiC, Si, GaN. The support can be ceramic, metal, glass, diamond, CVD diamond, Diamond-Like Carbon (DLC). The ceramic is such as $LiAlO_2$, ZnO, AlN. In an embodiment, the light-emitting element does not have a growth substrate or a support, and has a thickness of about 5 to 10 μm.

Figure 1B:
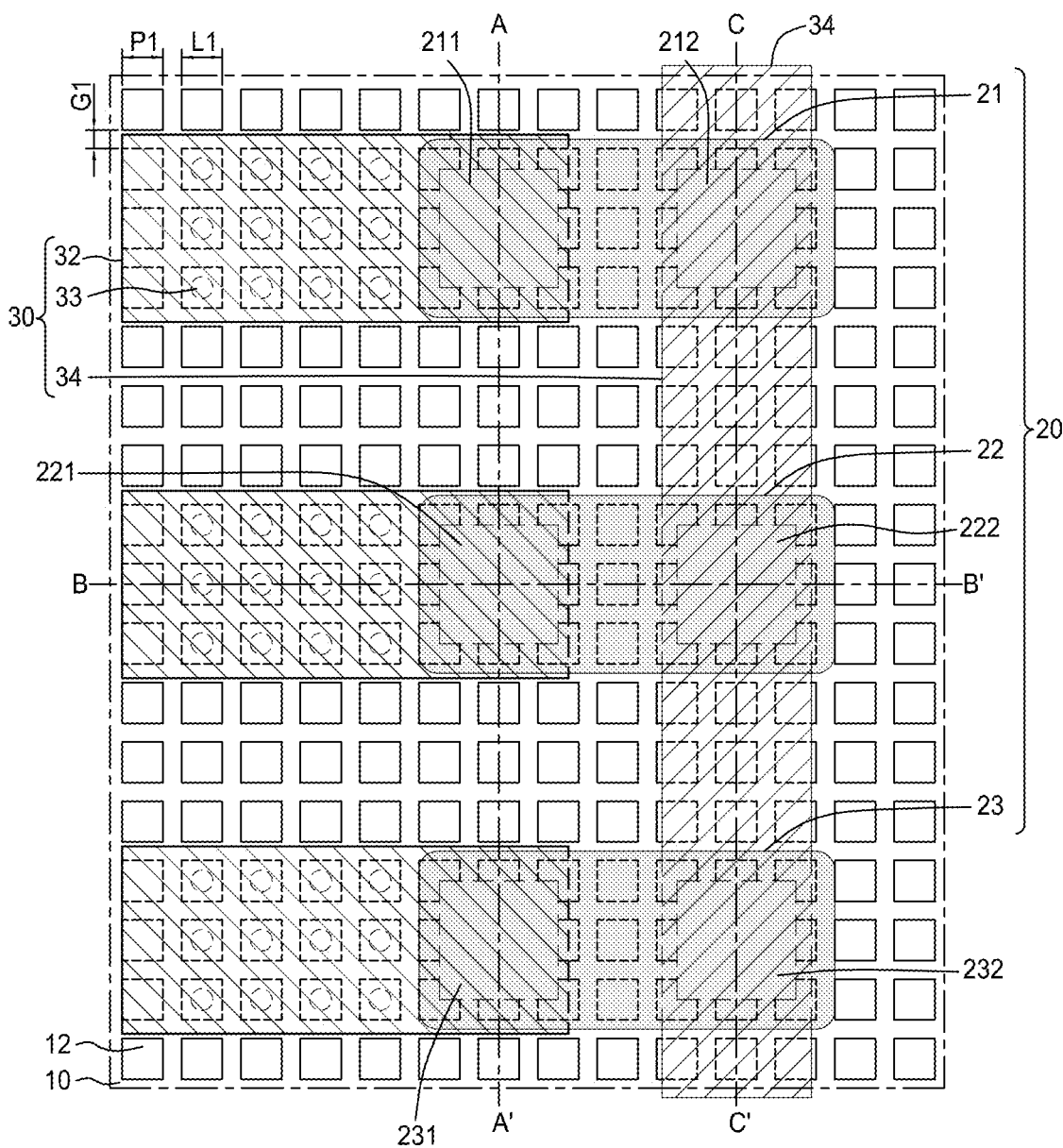
FIG. 1B shows a partial enlarged top view of a display device shown in FIG. 1A.

FIG. 1B shows a partial enlarged top view of a pixel 20 of a display device 100 shown in FIG. 1A. The pixel 20 has a plurality of LEDs (21, 22, 23) which is arranged in an array, and the longer sides of every LEDs (21, 22, 23) are parallel to each other. Each LEDs (21, 22, 23) is a flip-chip type LED and has a first electrode pad and a second electrode pad which are oriented to face to the circuit board 10 of the corresponding LED. In details, the LED 21 has a first electrode pad 211 and a second electrode pad 212. The LED 22 has a first electrode pad 221 and a second electrode pad 222. The LED 23 has a first electrode pad 231 and a second electrode pad 232. The first electrode pad (211, 221, 231) and the second pad (212, 222, 232) have opposite polarities. In an embodiment, the first electrode pad has an anode polarity, and the second electrode pad has a cathode polarity. The redistribution layer 30 is located on the circuit board and between the electrode pads (211, 212, 221, 222, 231, 232) and the circuit board 10. Each control conductive plate 32 is electrically connected to the first electrode pad (211, 221, 231) of a single one LED (21, 22, 23). A common conductive strip 34 is electrically connected to several second electrode pads (212, 222, 232) belonging to different LEDs (21, 22, 23). Taking the LED 21 as an example, the control conductive plate 32 has a rectangular shape in a plan view, and is electrically connected to the first electrode pad 211. The common conductive strip 34 is electrically connected to the second electrode pad 212. The area of the control conductive plate 32 is larger than that of the first electrode pad 211, and the area of common conductive strip 34 is larger than that of the second electrode pad 212. With such an arrangement, the bonding alignment can be more easily implemented between the LED and the circuit board 10, and the yield rate of bonding process is therefore increased.

As shown in FIG. 1B, the redistribution layer 30 further includes a plurality of conductive posts 33 electrically connected to one control conductive plate 32 and the corresponding first pads 12. In a plan view, the plurality of conductive posts 33 is not overlapped with the LED (21, 22, 23). In a top view, taking the LED 21 as an example, every conductive posts 33 under the control conductive plate 32 are located away from and not overlapped with the projected area of the LED 21, and connected to respective first pads 12. In other words, one control conductive plate 32 is electrically connected to the plurality of first pads 12 via the plurality of conductive posts 33. A single LED can be inputted a higher current (for example, more than 30 μA) through a group of first pads 12 which are located under a single control conductive plate 32, so as a higher brightness can be generated. The redistribution layer 30 provides an interconnection between the circuit board 10 and the plurality of LEDs. If the LED or the electrode pad changes its size, the sizes and the locations of the first pads 12 and the second pad 11 do not need to be changed accordingly. If the pitch between two adjacent LEDs, the size of one or more LEDs, or the arrangement pattern of LEDs is changed, without re-allocating the plurality of first pads 12 and second pad 11 on the circuit board 10 the redistribution layer 30 can be accordingly placed in new regions to meet the change and electrically connecting the circuit board 10 and the LEDs. Hence, there is no need to design different circuit boards to meet different requirement of different displays which has different LEDs or different LED arrangement.

Figure 1C:
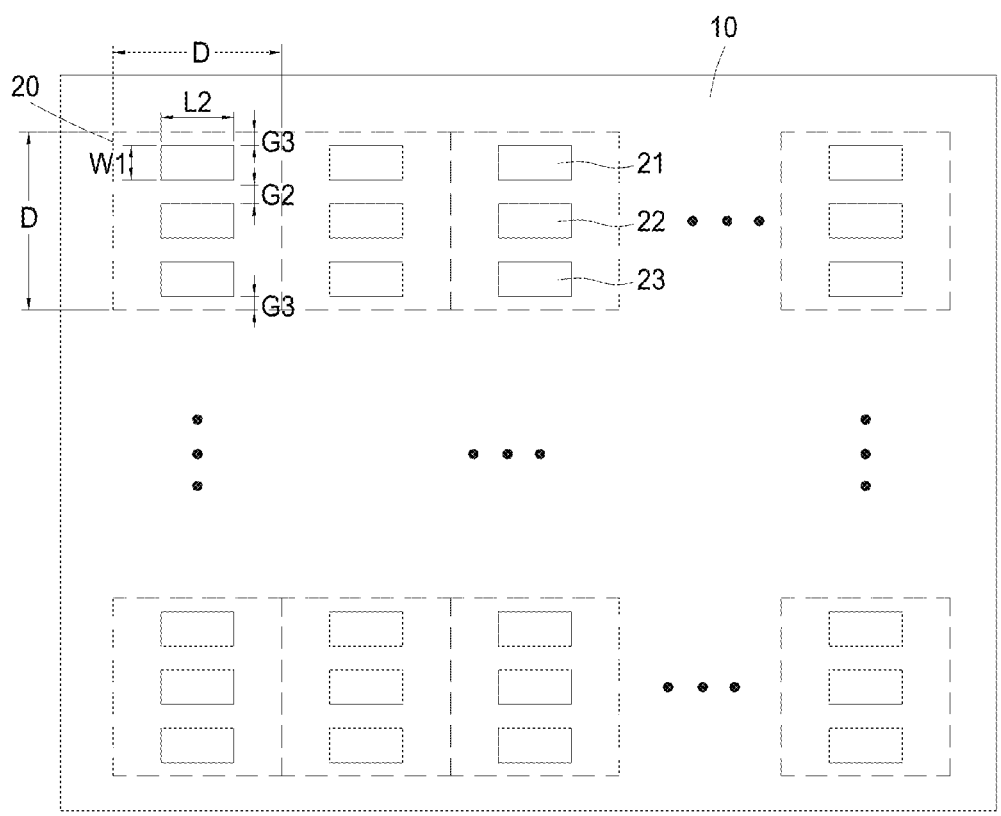
FIG. 1C shows a schematic view of a display device in accordance with an embodiment of the present disclosure.

FIG. 1C shows a schematic view of a display device 100 in accordance with an embodiment of the present disclosure. The shape of a single LED (21, 22, 23) in a plan view can be a rectangle or a square. A single pixel 20 herein is illustrated in a square, but the pixel 20 can be also formed in a shape of rectangle, pentagon, hexagon or other polygon. As shown in FIG. 1C, each LED (21, 22, 23) in one pixel 20 has a width W1 and a length L2. The length L2 and/or the width W1 is not greater than 100 μm. In another embodiment, the length L2 and/or width W1 is not greater than 50 μm. Two adjacent LEDs in one pixel are separated from each other by a gap G2 measured between their longer sides. The pixel 20 herein has an upper boundary, a lower boundary, and a side length D. The upper boundary is separated from its proximate LED (the first one from the top) by a distance G3. The lower boundary is separated from its proximate LED (the first one from the bottom) by a distance G4. G3 is equal to or different from G4. In one embodiment, G3 and G4 are essentially identical, and are about a half of G2. Therefore, D=3×W1+2×G2+2×G3 or =3×W1+3×G2 or =3×W1+6×G3. In one embodiment, the dimension of the pixel 10 is D×D, the length D is less than 200 μm. That is, the dimension of one pixel 20 is less than 200×200 μm. In one embodiment, W1 is about 30 μm, L2 is about 60 μm, G2 is about 10 μm, and the length D is about 120 μm, and the dimension of a single pixel 20 is about 120 μm×120 μm.

FIGS. 2A-2C show several cross-sectional views taken in the display device 100 shown in FIG. 1A. FIG. 2A shows a cross-sectional view taken along line A-A' shown in FIG. 1A. FIG. 2B shows a cross-sectional view taken along line B-B' shown in FIG. 1A. FIG. 2C shows a cross-sectional view taken along line C-C' shown in FIG. 1A. The redistribution layer 30 includes an insulation layer 31, a plurality of control conductive plates 32, a plurality of conductive posts 33, and a plurality of common conductive strips 34.

FIG. 2A shows a cross-section view taken along line A-A' passing through several groups of the first electrode pads. Each group includes at least three first electrode pads. Each first electrode pad in one group belongs to respective LED within one single pixel. As shown in FIG. 2A, the first electrode pads (211, 221, 231) of the LEDs (21, 22, 23) which belong to the same pixel 20 is connected to respective control conductive plate 32. The first pad 12 disposed under the LED (21, 22, 23) is not electrically connected to the first electrode pad (211, 221, 231) and the control conductive plates 32. The first pad 12 disposed under the LED (21, 22, 23) is electrically isolated from the LED (21, 22, 23) by the insulation layer 31. The insulation layer 31 is sandwiched between the plurality of the control conductive plates 32 and the plurality of first pads 12.

FIG. 2B shows a cross-sectional view taken along the line B-B' passing through several LEDs which all emit the same color but belong to the different pixels. As shown in FIG. 2B, taking the first LED 21 as an example, the different first LEDs 21 belong to different pixels 20. The first electrode pad 211 of the first LED 21 is electrically connected to the plurality of first pads 12 of the circuit board 10 through the control conductive plate 32 and the plurality of conductive posts 33. The control conductive plate 32 is connected to the first electrode pad 211 and laterally extends beyond the coverage of the first LED 21. In an orthogonal projected direction, the plurality of conductive posts 33 is not overlapped with the first electrode pads 211, the second electrode pads 212, and the first LED 21. Hence, the first electrode pad 211 is electrically connected to the plurality of the first pads 12 for receiving more control power to drive the first LED 21 through the control conductive plate 32 and the plurality of conductive posts 33. The second electrode pad 212 is connected to the common conductive strip 34 and electrically isolated from the plurality first pads 12 by the insulation layer 31. The insulation layer 31 is disposed between first LED 21 and the circuit board 10, and under the control conductive plate 32 and the common conductive strip 34. The plurality of conductive posts 33 is located right above respective first pad 12, and penetrates the insulation layer 31. The plurality of conductive posts 33 connects the plurality of first pads 12 and the control conductive plate 32. The insulation layer 31 surrounds the plurality of conductive posts 33. The control conductive plate 32 has a first portion 321 located on the plurality of conductive posts 33, and a second portion 322 located directly under the first electrode pad 211 without covering the plurality of conductive posts 33. The first portion 321 can have a flat top surface or an uneven top surface (not shown). The uneven top surface can be caused by reproducing a similar contour of the conductive posts 33. The top surfaces of the second portion 322 and the common conductive strip 34 have flat surfaces due to not covering the conductive posts 33. The top surface of the first portion 321 is more uneven than that of the second portion 322. With mounting on a relatively flat surface, the LEDs can be more easily placed in a straight configuration, and a better image quality can be obtained.

FIG. 2C shows a cross-section view taken along line C-C' passing through the different second electrode pads of different LEDs belonging to the same pixel. As shown in FIG. 2C, each of the second electrode pads (212, 222, 232) of the plurality of LEDs (21, 22, 23) which belong to the same pixel 20 is connected to a common conductive strip 34. The common conductive strip is located on the plurality of first pads 12. The insulation layer 31 is sandwiched between the common conductive strip 34 and the plurality of first pads 12 for being electrically isolated from the second electrode pads 212, 222, 232 and the plurality of first pads 12. The common conductive strip 34 is connected to the second pad 11 which is located at the peripheral region of the circuit board 10. Therefore, the plurality of LEDs is electrically connected to the second pad 11 through the common conductive strip 34. As shown in FIG. 1C, a portion of the plurality of first pads 12 is completely covered by the insulation layer, and overlapped with the common conductive strip 34 and the insulation layer 31 in an orthogonal projected direction.

Figure 3E:
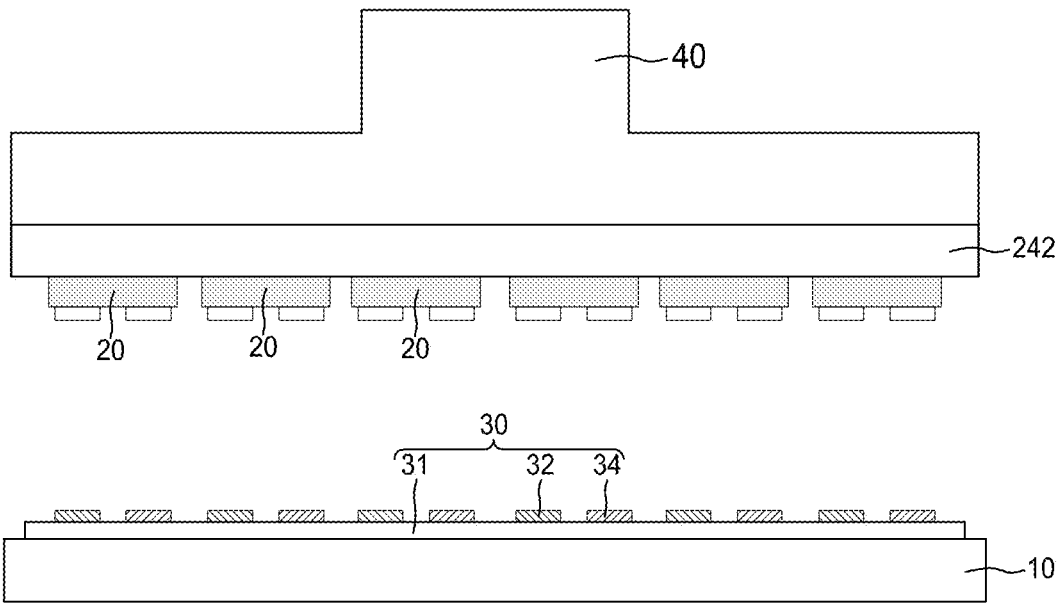

FIG. 3A-3F show steps of manufacturing a display device 100 in accordance with an embodiment of the present disclosure. As shown in FIG. 3A, a plurality of the first LEDs 21 is formed on the first carrier 213. A plurality of the second LEDs 22 is formed on the second carrier 223. A plurality of the third LEDs 23 is formed on the third carrier 233. The first carrier 213, the second carrier 223, and the third carrier 233 can be sapphire, glass, or a releasable tape. The releasable tape can be polyimide (PI) tape, thermal release tape, UV tape, chemical release tape, or blue tape. Each of the first LEDs 21, the second LEDs 22, and the third LEDs 23 has a first electrode pad (211, 221, 231) and a second electrode pad (212, 222, 232). Take the plurality of first LEDs 21 as an example to describe the structure, the plurality of second LEDs 22 and the plurality of third LEDs 23 have the same structures as the plurality of first LED 21. The first LED 21 has a first electrode pad 211 and a second electrode pad 212 located on a same side opposite to the first carrier 213 of the first LED 21. The plurality of first LED 21 can be classified into a predetermined category. The category can be wavelength distribution, or the luminous intensity.

As shown in FIG. 3B, a first temporary carrier 214 is used to adhere all of the first LEDs 21 formed on the first carrier 213 through the releasable tape 215. A second temporary carrier 224 is used to adhere all of the second LEDs 22 formed on the second carrier 223 through the releasable tape 225. A third temporary carrier 234 is used to adhere all of the third LEDs 23 formed on the third carrier 233 through the releasable tape 235. Taking the first plurality of LEDs 21 as an example to describe the structure, the plurality of second LEDs 22 and the plurality of third LEDs 23 have the same structure as the plurality of first LED 21. The first electrode pad 211 and the second electrode pad 212 of the first plurality of LEDs 21 are adhered to the releasable tape 215 for being transferred in the next process. The first temporary carrier 214, the second temporary carrier 224, and the third temporary carrier 234 can be glass or sapphire. The releasable tape 215, 225, 235 can be Polyimide (PI) tape, thermal release tape, UV tape, chemical release tape, or blue tape.

As shown in FIG. 3C, the plurality of first LEDs 21, the plurality of second LEDs 22, and the plurality of third LEDs 23 are transferred to the third carrier 241 and are grouped as a plurality of pixels 20. In details, the second electrode pads and the first electrode pads of the plurality of first LED 21, the plurality of second LED 22, and the plurality of third LED are temporally fixed on the third carrier 241. The plurality of first LEDs 21, the plurality of second LEDs 22, and the plurality of third LEDs 23 are arranged in the pixel array configuration. As shown in FIG. 3D, the plurality of pixels 20 is transferred to the fourth carrier 242 for exposing the first electrode pads and the second electrode pads of the plurality of LEDs (21, 22, 23). The third carrier 241 and the fourth carrier can be releasable tape, such as Polyimide (PI) tape, thermal release tape, UV tape, chemical release tape, or blue tape.

Figure 3F:
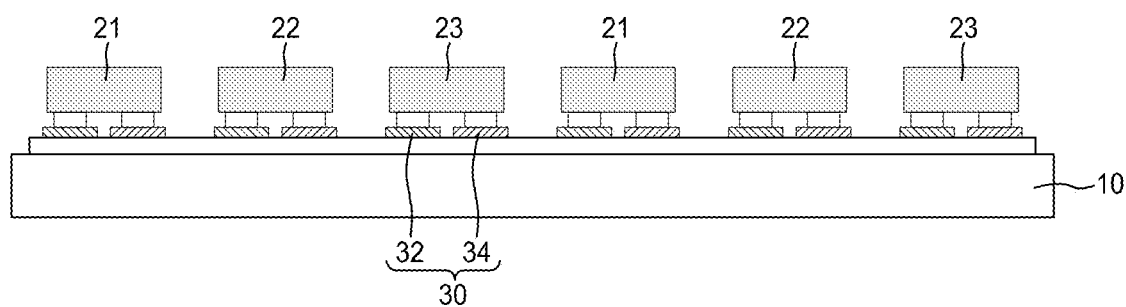

As shown in FIG. 3E, a circuit board 10 is provided, and a redistribution layer 30 is formed on the circuit board 10. The top surfaces of the control conductive plates 32 and the common conductive strips 34 are exposed for bonding with the LEDs. A transfer device 40, such as a stamp, contacts to the fourth carrier 242 shown in FIG. 3D and moves close to the circuit board 10. In other words, the plurality of pixels 20 adhered on the fourth carrier 242 is picked up by the transfer device 40 and aligned with the plurality of control conductive plates 32 and the plurality of common conductive strips 34. As shown in FIG. 3F, the alignment bonding is performed between the plurality of pixels 20 and the redistribution layer 30. Then, the plurality of pixels 20 are removed from the transfer device 40 and the fourth carrier 242 by laser lift-off, heat separation, or dissolution. The transferring steps shown in FIG. 3E and FIG. 3F can be implemented several times for making the display device 100.

Figure 4:
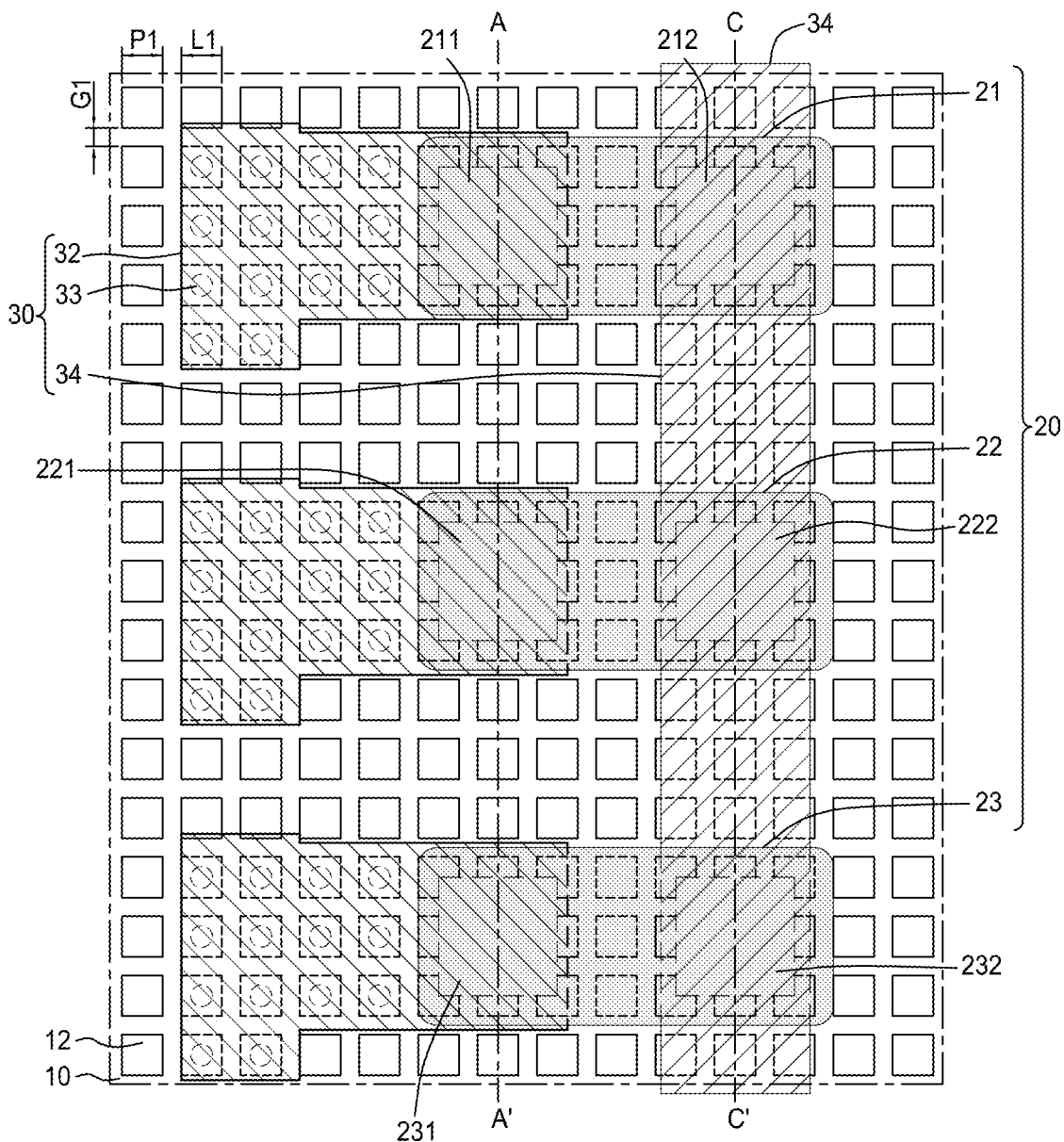
FIG. 4 shows a partial enlarged view of a display device in accordance with another embodiment of the present disclosure.

FIG. 4 shows a partial top view of a display device 100 in accordance with another embodiment of the present disclosure. The control conductive plate 32 is not formed in a rectangular shape. The control conductive plate 32 can have any shape for connecting the plurality of the first pads 12. The shape of the control conductive plate 32 can be adjusted according to the pitch between the two adjacent LEDs, the pitch between the two adjacent pixels, and/or required driving power of one single LED.

Based on the foregoing descriptions, the pixel array which has a plurality of flip-type LEDs can be bonded on the circuit board through the redistribution layer. Therefore, there is no need to design different types of circuit boards for different specifications of display device. The different redistribution layers are only needed to form on the same circuit board to adapt for different specifications of display device. Besides, the LED can obtain more driving power through the redistribution layer for increasing the brightness.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A display device, comprising:
    a circuit board comprising a plurality of first pads and a second pad surrounding the plurality of first pads;
    an insulation layer covering the plurality of first pads;
    a plurality of LEDs located on the insulating layer, each of the plurality of LEDs comprising a first electrode pad and a second electrode pad;
    a plurality of conductive posts located on and connected to a first portion of the plurality of first pads, and penetrating the insulation layer;
    a control conductive plate electrically connected to one of the first electrode pads and the plurality of conductive posts; and
    a common conductive strip located on the insulation layer and electrically connected to the second pad and one of the second electrode pad,
    wherein each of the plurality of first pads is electrically connected to at least two of the first pads, and
    wherein a second portion of the plurality of first pads is completely covered by the insulation layer, the second portion of the plurality of first pads is overlapped with the common conductive strip and the insulation layer in an orthogonal projected direction.

2. The display device according to claim 1, wherein a number of the plurality of the first pads is larger than that of the plurality of LEDs.

3. The display device according to claim 1, wherein the plurality of LEDs is flip type.

4. The display device according to claim 1, wherein the plurality of conductive posts is located outside from the plurality of LEDs in a top view.

5. The display device according to claim 1, wherein the plurality of LEDs is arranged in a plurality of pixels, each of the plurality of pixels comprises at least three LEDs.

6. The display device according to claim 1, wherein a portion of the plurality of LEDs located in a same column is electrically connected to the common conductive strip.

7. The display device according to claim 1, wherein the second electrode pad is not overlapped with any conductive post in an orthogonal projected direction.

8. The display device according to claim 1, wherein the control conductive plate has an extending direction is different from that of the common conductive strip.

9. The display device according to claim 1, further comprising an encapsulating layer on the plurality of LEDs.

10. The display device according to claim 9, wherein the encapsulating layer is pervious to light.

11. The display device according to claim 9, wherein the encapsulating layer comprises carbon powder.

12. The display device according to claim 1, wherein the circuit board can be CMOS circuit board or TFT circuit board.

13. The display device according to claim 1, wherein the second portion of the plurality of first pads is electrically isolated from the first electrode pad and the second electrode pad.

14. The display device according to claim 1, wherein the second portion of the plurality of first pads is electrically isolated from the plurality of LEDs.

15. The display device according to claim 1, wherein a portion of the plurality of first pads overlapped with the plurality of LEDs in an orthogonal projected direction is electrically isolated from the plurality of LEDs.

16. The display device according to claim 1, wherein the plurality of LEDs comprises a pixel which comprises a first LED and a second LED, the second electrode pads of the first LED and the second LED are electrically connected to the common conductive strip.

17. A display substrate, comprising:
- a circuit board comprising a plurality of first pads and a second pad surrounding the plurality of first pads; and
- a redistribution layer disposed on the circuit board and comprising:
  - an insulation layer covering the plurality of first pads;
  - a plurality of conductive posts located on and connected to a first portion of the plurality of first pads and penetrating the insulation layer;
  - a control conductive plate located on the insulation layer electrically connected to the plurality of conductive posts; and
  - a common conductive strip located on the insulation layer and electrically isolated from the plurality of first pads,
  - wherein control conductive plate is electrically connected to at least two of first pads, and
  - wherein the control conductive plate has an extending direction is different from that of the common conductive strip.

18. The display substrate according to claim 17, wherein the control conductive plate has a first portion covering the plurality of conductive posts and a second portion without covering the plurality of conductive posts.

19. The display substrate according to claim 18, wherein the first portion has a top surface which is more uneven than that of a top surface of the second portion.

20. The display substrate according to claim 17, wherein the common conductive strip has a flat top surface.

* * * * *